(12) United States Patent
Bottini et al.

(10) Patent No.: US 6,437,395 B2
(45) Date of Patent: Aug. 20, 2002

(54) PROCESS FOR THE MANUFACTURING OF AN ELECTRICALLY PROGRAMMABLE NON-VOLATILE MEMORY DEVICE

(75) Inventors: Roberta Bottini, Lissone; Giovanna Dalla Libera, Monza; Bruno Vajana, Bergamo; Carlo Cremonesi, Vaprio D'Adda, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/776,105

(22) Filed: Feb. 1, 2001

Related U.S. Application Data

(62) Division of application No. 09/130,720, filed on Aug. 6, 1998, now Pat. No. 6,194,270.

(30) Foreign Application Priority Data

Aug. 7, 1997 (IT) .......................................... MI97A1902

(51) Int. Cl.[7] .............................................. H01L 29/788
(52) U.S. Cl. ...................................... 257/315; 257/321
(58) Field of Search ................................ 257/321, 320, 257/315; 438/264, 257

(56) References Cited

U.S. PATENT DOCUMENTS

| | | | |
|---|---|---|---|
| 4,823,175 A | 4/1989 | Fontana | 357/23.5 |
| 5,424,232 A | 6/1995 | Yamauchi | 437/43 |
| 5,861,347 A | 1/1999 | Maiti et al. | 438/787 |

Primary Examiner—Steven Loke
Assistant Examiner—Junghwa M Im
(74) Attorney, Agent, or Firm—Lisa K. Jorgenson; Robert Iannucci; Seed IP Law Group PLLC

(57) ABSTRACT

A process for manufacturing a programmable non-volatile memory device having floating-gate MOS transistors, and first and second MOSFETs, the second MOSFETs capable of sustaining gate voltages higher than the first MOSFETs, by forming a first gate oxide layer for the floating-gate MOS transistors, a second gate oxide layer for the first MOSFETs, and a third gate oxide layer for the second MOSFETs. The process includes: forming a first oxide layer over a substrate; selectively removing the first oxide layer from surface regions over the first MOSFETs, but not from surface regions over the floating-gate MOS transistors or the second MOSFETs; forming a second oxide layer over the first oxide layer and the regions over the first MOSFETs; removing the first and second oxide layer from a tunnel oxide region of the floating-gate MOS transistors; and forming a tunnel oxide layer over the second oxide layer and tunnel region oxide layer.

11 Claims, 3 Drawing Sheets

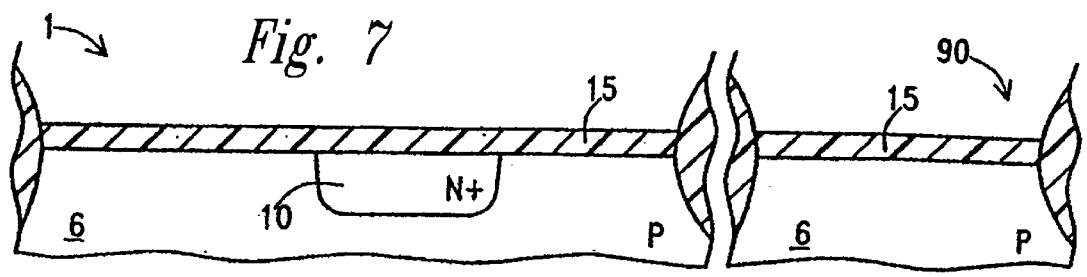
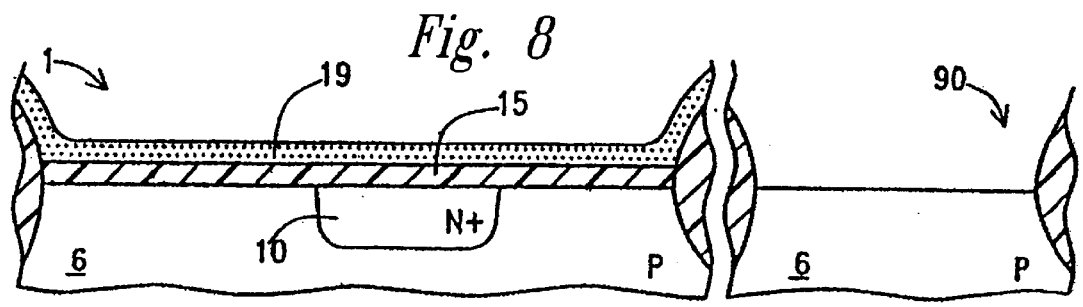
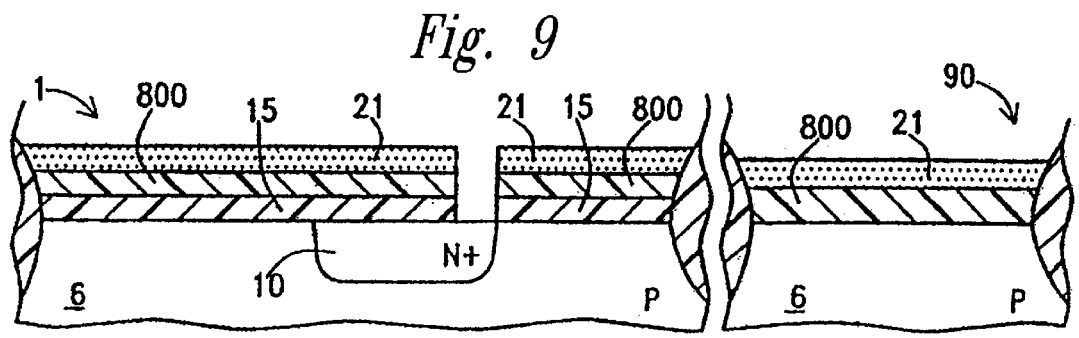
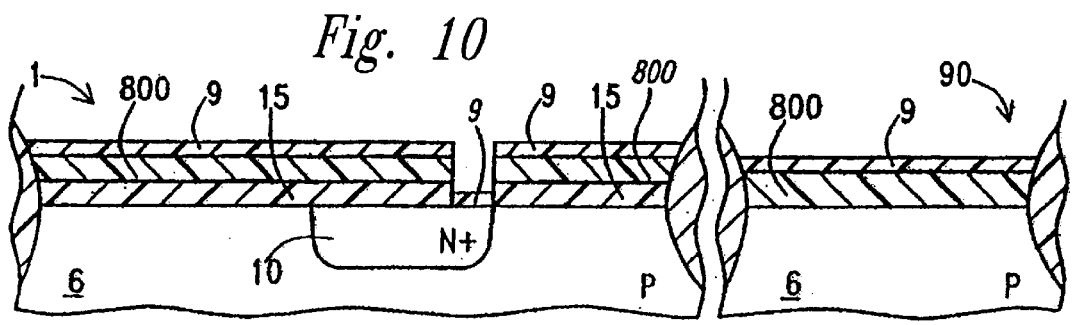
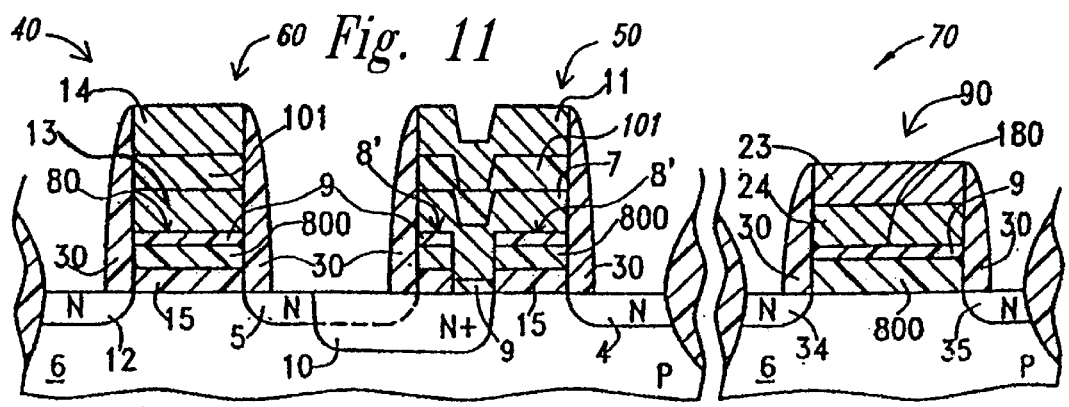

PROCESS FOR THE MANUFACTURING OF AN ELECTRICALLY PROGRAMMABLE NON-VOLATILE MEMORY DEVICE

This application is a divisional of U.S. Pat. application No. 09/130,720, filed Aug. 6, 1998, now U.S. Pat. No. 6,194,270.

TECHNICAL FIELD

The present invention concerns a process for the manufacturing of an electrically programmable non-volatile memory device, such as a single (SP) or double (DP) polysilicon level FLOTOX (Floating-gate Tunneling Oxide) EEPROM memory. Particularly, the invention relates to the formation of tunneling areas of EEPROM memory cells.

BACKGROUND OF THE INVENTION

It is known that for the manufacturing of these memory devices it is necessary to provide for layers of different of different thickness in the active areas of the devices forming the memory cells.

For forming such oxide layers, a selective removal of the different layers that are successively grown in the active areas is necessary. To this purpose, several chemical etching processes are performed to remove the unnecessary layers from the silicon surface.

Examples of electrically programmable non-volatile memory cells are the double polysilicon level (DP) FLOTOX EEPROM memory cells, one of which is shown in FIGS. 1 and 2 and includes a floating-gate MOS transistor 2 and a selection MOSFET 3. The floating-gate MOS transistor 2 comprises an N type source region 4 and an N type drain region 5 both formed in a P type semiconductor substrate or well 6, spaced apart from each other. The portion of P type substrate or well comprised between the source and drain regions 4 and 5 forms a channel region, and a floating gate electrode 7 (formed in a first polysilicon level) is placed over the channel region and part of the drain region 5, with the interposition of a gate oxide layer 8 having typically a thickness of 200 Å. At the drain region 5, the gate oxide 8 has a thinner portion 9, with typical thickness of about 70 Å, called tunnel oxide. The drain region 5 comprises, under the tunnel oxide 9, a region 10 heavily doped of the N type. A control gate electrode 11 (formed in a second polysilicon level) is placed over the floating gate electrode 7 with the interposition of a dielectric layer 100.

The selection MOSFET 3 of each memory cell is connected in series to the respective floating-gate MOS transistor 2, and comprises an N type source region coincident with the drain region 5 of the floating-gate MOS transistor 2, and an N type drain region 12 formed in the P type substrate or well 6. The region of the substrate or well 6 comprised between the drain region 12 and the source region 5 of MOSFET 3 forms a channel region, over which two polysilicon electrodes 13, 14 are placed, forming the gate of MOSFET 3. The first electrode 13 is separated from the channel region by a gate oxide layer 80. The second electrode 14 is separated from the first electrode 13 by a dielectric layer 101.

Conventionally, as far as the selection transistors 3 are concerned, the two polysilicon electrodes 13, 14 belong to respective lines formed from the first and the second polysilicon levels, and said lines are electrically short-circuited in a region of the array not shown in FIG. 1.

The oxide layer 80 is generally thicker than the oxide layer 8 (typically the oxide layer 80 is 300 Å thick), since the former must be capable of sustaining the voltages involved in the process of programming the memory cells, voltages which are higher than the supply voltage.

With reference to FIGS. 3 to 6, the conventional process for the fabrication of an EEPROM memory device includes using FLOTOX EEPROM memory cells and MOSFETs 90 for the circuitry. The process provides for defining active areas for the memory cells and the MOSFETs of the circuitry; the formation of a sacrificial oxide layer; the implantation of an N type dopant for forming the regions 10 of the memory cells, and a thermal diffusion process for diffusing the dopant; and the subsequent removal of the sacrificial oxide.

By means of a thermal oxidation a first gate oxide layer 15 is formed, having a thickness of about 200 Å. The oxide layer 15 is formed over the active areas of both the memory cells 1 and the MOSFETs 90 of the circuitry (FIG. 3).

By means of a conventional photolithographic process, providing for the deposition of a photoresist 16 and the selective etching thereof, the first oxide layer 15 is removed from the active area region wherein the floating-gate MOSFET 2 will be formed, and from the active areas where low-voltage (LV) transistors 90 of the circuitry will be formed (FIG. 4).

By means of thermal oxidation a second gate oxide layer 800 is formed having a thickness of about 170 Å. By means of a conventional photolithographic technique, providing for the deposition of another photoresist layer 17 and the selective etching thereof, the second oxide layer 800 is selectively removed from the tunnel region of the memory cell (FIG. 5). By means of a further thermal oxidation the tunnel oxide layer 9 is formed, having a typical thickness of about 70 Å.

The memory cell 1 and the MOSFETs 90 of the circuitry are then conventionally completed by defining their gates, forming the source and drain regions, forming insulating spacers, and so on.

As it will be appreciated, the gate oxide layer 80 of the selection MOSFET 3, as well as the gate oxide layer of the high-voltage (HV) MOSFETs of the circuitry that, as the selection MOSFET 3 have to sustain the high voltages involved in the programming operation, is formed by a stack of the three oxide layers 15, 800 and 9. The gate oxide layer 8 of the floating-gate MOS transistor 2, as well as the gate oxide layer of the low-voltage (LV) MOSFETs of the circuitry is instead formed by a stack of the two oxide layers 800 and 9.

A drawback of this process is due to the fact that the surface of the silicon where the tunnel oxide 9 is grown is affected by the removal of the first and second oxide layers. The twice removal increases the probability of damaging the silicon surface, negatively affecting the reliability of the tunnel oxide subsequently grown, and thus negatively affecting the reliability of the memory device.

SUMMARY OF THE INVENTION

In view of the state of the art described, it is an object of the invention that of providing a manufacturing process overcoming the above-mentioned drawback.

According to an embodiment of the present invention, such an object is achieved by means of a process for the manufacturing of an electrically programmable non-volatile memory device comprising electrically programmable non-volatile memory cells comprising floating-gate MOS transistors, a first kind of MOSFETs, and a second kind of MOSFETs capable of sustaining gate voltages higher than sustainable by the MOSFETs of the first kind, said process providing for forming a first gate oxide layer for the floating-gate MOS transistors, a second gate oxide layer for the MOSFETs of the first kind, and a third gate oxide layer for the MOSFETs of the second kind, the first gate oxide layer further comprising a tunnel oxide region. The process includes:

- forming over the surface of a semiconductor material a first layer of oxide;
- selectively removing the first layer of oxide from regions of said surface dedicated to the MOSFETs of the first kind, but not from the regions dedicated to the floating-gate MOS transistors nor to the MOSFETs of the second kind;
- forming a second layer of oxide over the first layer of oxide and over said regions dedicated to the MOSFETs of the first kind;
- simultaneously removing the first and the second layer of oxide only from the tunnel oxide region of the floating-gate MOS transistors; and
- forming over the second layer of oxide and over said tunnel region oxide for the floating-gate MOS transistors a tunnel oxide layer,
- whereby said third gate oxide layer and said first gate oxide layer, except in the tunnel oxide region, are formed by the superposition of the first layer of oxide, the second layer of oxide and the tunnel oxide layer, said second gate oxide layer being formed by the superposition of the second layer of oxide and the tunnel oxide layer.

The process has a smaller number of phases negatively affecting the quality of the surfaces subjected to treatment. Particularly, for the formation of the tunnel region of a FLOTOX EEPROM memory cell, the silicon surface where the tunnel oxide will be formed is exposed only once to the chemical etchings for the removal of oxides. The reliability of the memory devices is thus improved. This is clearly advantageous in view of the technology trend towards memory devices having large capacity, for which it is more and more difficult to assure reliability.

BRIEF DESCRIPTION OF THE DRAWINGS

The features and advantages of the present invention will be made apparent from the following detailed description of an embodiment thereof, illustrated by way of a non-limiting example only in the annexed drawings, wherein:

FIGS. 7 to 11 show the main steps of a process according to the invention.

DETAILED DESCRIPTION OF THE INVENTION

Figure 1:
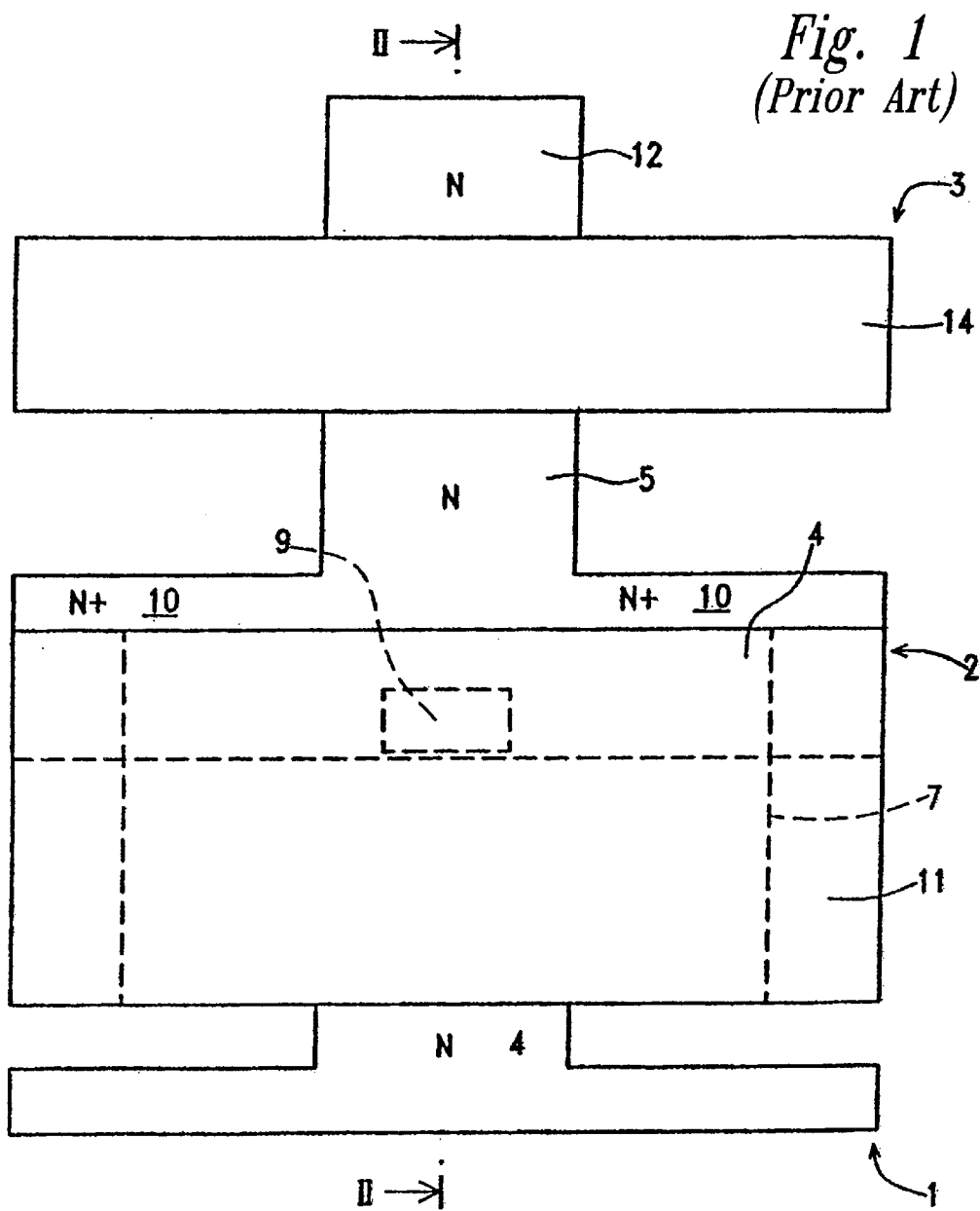
FIG. 1 is a top plan view of a conventional double polysilicon level FLOTOX EEPROM memory cell.
Figure 2:
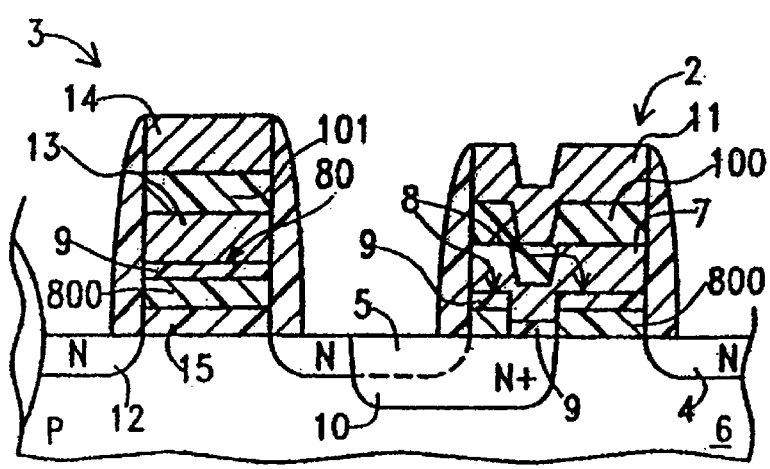
FIG. 2 is a cross-sectional view of the double polysilicon level FLOTOX EEPROM memory cell along line II—II in FIG. 1.
Figure 3:
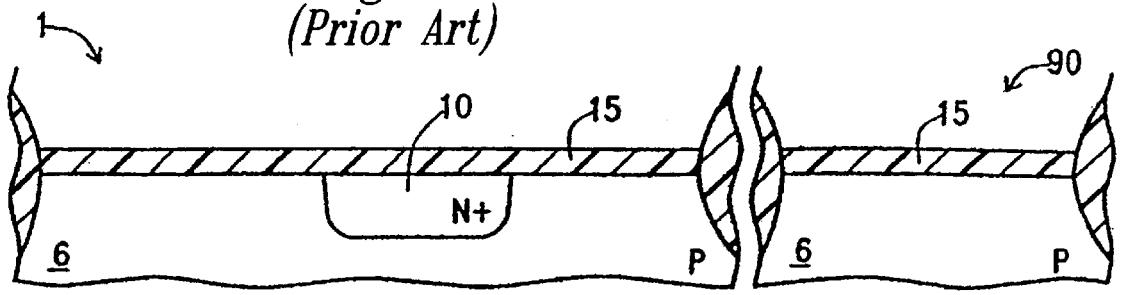
FIGS. 3 to 6 show some steps of a conventional process for the formation of an EEPROM memory cell and a MOSFET of the circuitry.
Figure 4:
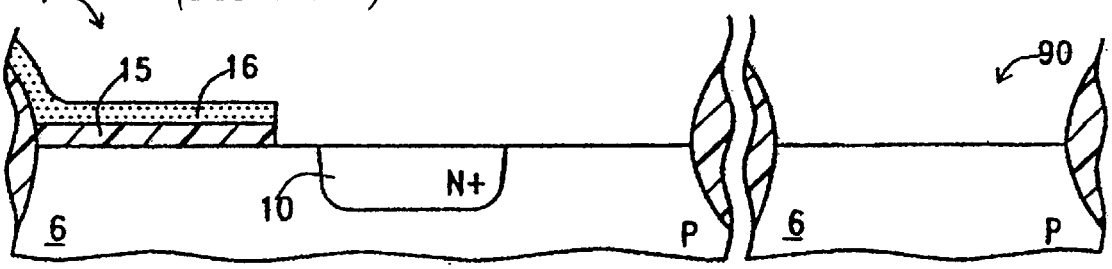
Figure 5:
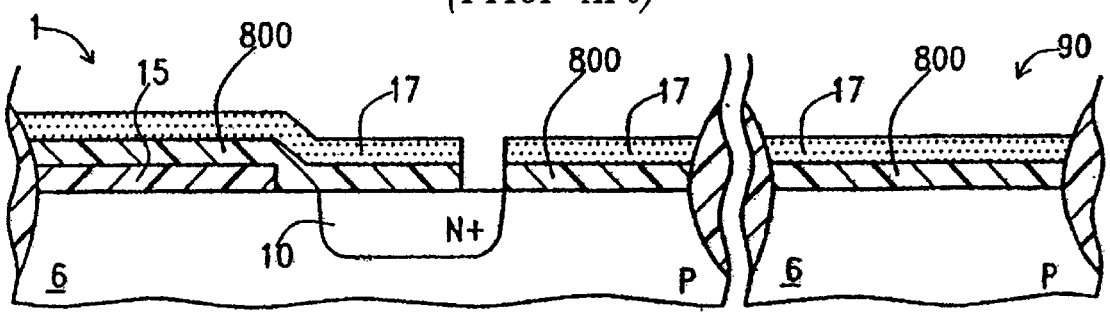
Figure 6:
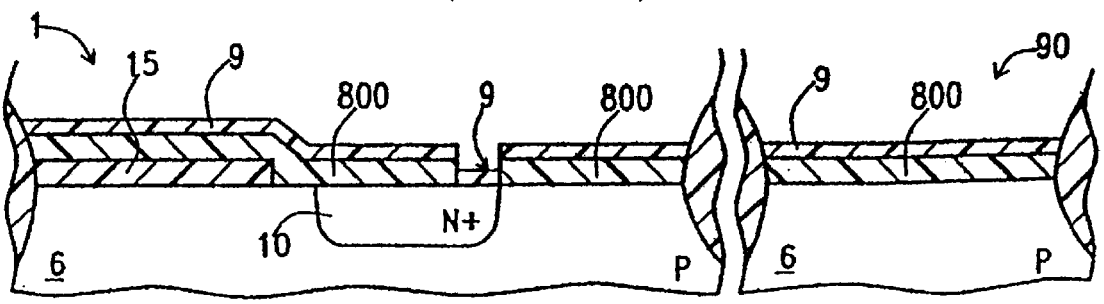

In FIGS. 7 to 11 the main steps of a process according to the invention are shown, for the fabrication of tunneling areas of FLOTOX EEPROM memory cells 40 and the transistors of the circuitry 70. Each memory cell 40 conventionally comprises a floating-gate MOS transistor 50 and a selection transistor 60.

The process according to the invention comprises, as the conventional process, the formation of active areas for the memory cells 40 and for the MOSFETs 90 of the circuitry, and the formation of N type regions 10 for the floating-gate MOS transistors 2, by means of ion implantation and subsequent diffusion.

Over the active areas of the cells and the MOSFETs of the circuitry there is then formed a first layer of oxide 15, having typical thickness of about 200 Å, for example formed by means of thermal oxidation (FIG. 7).

After having deposited a photoresist layer 19 and having selectively removed the same from over the active areas for the low-voltage MOSFETs LV of the circuitry, the layer of oxide 15 is selectively removed from the active area of the MOSFETs 90 of the circuitry (FIG. 8). Thus, differently from the conventional process, the first layer of oxide 15 is left over the whole active area for the memory cells.

A second layer of oxide 800 is then formed, having a thickness of about 170 Å. After having deposited and selectively removed a photoresist layer 21 in order to expose the tunnel oxide regions of the memory cells, the first and the second layers of oxide 15, 800 are selectively removed from such tunnel regions (FIG. 9).

The tunnel oxide layer 9 is then formed, having a typical thickness of about 70 Å.

Similarly to the conventional process, the MOSFET 90 has its gate oxide formed by the superposition of the oxide layers 800 and 9.

As is clearly apparent, in the process according to the illustrated embodiment of the invention, the regions of the surface of the silicon layer 6 which are to be covered solely by the tunnel oxide layer 9 undergo only one etching process. This means a lower defectiveness of the tunnel oxide of the memory cells, and thus a higher reliability of the same.

In the following steps of the process, a first level of polysilicon is deposited. From the first level of polysilicon, the first level 13 of the gate electrode of the selection MOSFET 60, the floating gate 7 of the floating-gate MOS transistor 50, and a first level 24 of the gate electrode of the transistors of the circuitry are formed.

An intermediate dielectric layer 100, 101 is then formed over the whole surface of the chip; the intermediate dielectric layer is completely removed from the regions where the transistors 90 of the circuitry will be formed.

A second level of polysilicon is then deposited. From the second level of polysilicon, the control gate 11 of the floating-gate. MOS transistor 58, the second level 14 of the gate electrode of the selection MOSFET 60, and a second level 23 of the gate electrode of the transistors 90 of the circuitry are formed.

Convention steps provide for the formation of spacers 30, the formation of source and drain regions 4, 5, 12, 34 and 35 of the memory cells 40 and the MOSFET of the circuitry 90, the formation of contacts, the formation of metal interconnection lines, and the final passivation of the whole memory cell array.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A semiconductor memory device, comprising:
   a semiconductor substrate having a first region for a first transistor, a second region for a second transistor, and a third region for a third transistor;
   a first layer of oxide over the first and second regions;
   a second layer of oxide over the first layer of oxide and over the first region, the first and second layers of oxide defining sidewalls of a gap at a portion of the second region; and
   a third layer of oxide over the second layer of oxide and in the gap, the third layer of oxide including a tunnel oxide layer formed in the gap, the tunnel oxide layer being a tunnel oxide layer for a floating gate of the second transistor.

2. The semiconductor memory device according to claim 1, further comprising respective drain and source regions of each of the first, second and third transistors, thereby defining three channel regions of the first, second, and third transistors respectively.

3. The semiconductor memory device according to claim 1 wherein the first, second, and third layers of oxide form a first gate oxide layer at the first region and a second gate oxide layer at the second region and the second and third layers of oxide form a third gate oxide layer at the third region, the first and second gate oxide layers each have a thickness of about 300 Å, the third gate oxide layer has a thickness of about 200 Å, and the tunnel oxide layer has a thickness of about 70 Å.

4. The semiconductor memory device according to claim 1 wherein the second transistor includes a floating gate memory cell and first transistor includes a selection transistor for programming the floating gate memory cell.

5. The semiconductor memory device according to claim 1, further comprising a common doped region in the semiconductor substrate adjacent to the first and second regions, the common doped region being a source region for the first transistor and a drain region for the second transistor and enabling the first transistor to act as a selection transistor for the second transistor.

6. An electrically programmable non-volatile memory device, comprising:
   a first MOSFET having a first gate oxide layer; and
   an electrically programmable non-volatile memory cell having a floating-gate MOS transistors and a second MOSFET capable of sustaining gate voltages higher than sustainable by the first MOSFET, the floating-gate MOS transistor having a second gate oxide layer that includes a tunnel oxide region, and the second MOSFET having a third gate oxide layer; the first MOSFET, second MOSFET, and floating-gate MOS transistor including:
   a semiconductor material;
   a patterned first oxide layer positioned on a surface of the semiconductor material at the floating gate MOS transistor and the second MOSFET;
   a patterned second oxide layer positioned over the first oxide layer and over a region of the semiconductor material dedicated to the second MOSFET, the first ans second oxide layers having a gap at the tunnel oxide region;
   a patterned tunnel oxide layer positioned in the gap and over the semiconductor material at the tunnel oxide region, the tunnel oxide layer also being positioned over the second oxide layer at the first and second MOSFETs and at the floating-gate MOS transistor, wherein the first oxide layer, second oxide layer, and tunnel oxide layer are part of the second and third gate oxide layers, and the second oxide layer and tunnel oxide layer are part of the first gate oxide layer.

7. The memory device of claim 6, wherein the second MOSFET is a selection MOSFET.

8. The memory device of claim 6, wherein the memroy cell is an EEPROM memory cell.

9. The memory device of calim 8, wherein the EEPROM memory cell is a FLOTOX cell.

10. The memory device claim 6, further comprising respective drain and source regions of each of the first and econd MOSFETs and the floating-gate MOS transistor, thereby defining three channel regions of the first and second MOSFETs and the floating-gate MOS transistor, respectively.

11. The process according to claim 6, wherein the second and third gate oxide layers each have a thickness of about 300 Å, the first gate oxide layer has a thickness of about 200 Å, and the tunnel oxide layer has a thickness of about 70 Å.

* * * * *

UNITED STATES PATENT AND TRADEMARK OFFICE
CERTIFICATE OF CORRECTION

PATENT NO. : 6,437,395 B2
DATED : August 20, 2002
INVENTOR(S) : Roberta Bottini et al.

It is certified that error appears in the above-identified patent and that said Letters Patent is hereby corrected as shown below:

<u>Column 6,</u>
Lines 14 and 15, "the first ans second oxide layers" should read as -- the first and second oxide layers --.
Lines 28 and 29, "wherein the memroy cell" should read as -- wherein the memory cell" --.
Lines 33 and 34, "first and econd MOSFETs" should read as -- first and second MOSFETs" --.
Line 38, "The process according to claim 6" should read as -- The device according to claim 6 --.

Signed and Sealed this

Twenty-fourth Day of December, 2002

JAMES E. ROGAN
*Director of the United States Patent and Trademark Office*